United States Patent
Yamashita

(10) Patent No.: US 7,835,183 B2
(45) Date of Patent: Nov. 16, 2010

(54) NONVOLATILE STORAGE DEVICE AND CONTROL METHOD THEREOF

(75) Inventor: Minoru Yamashita, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 411 days.

(21) Appl. No.: 11/986,331

(22) Filed: Nov. 20, 2007

(65) Prior Publication Data

US 2008/0144388 A1 Jun. 19, 2008

Related U.S. Application Data

(63) Continuation-in-part of application No. PCT/JP2006/40280, filed on Dec. 18, 2006.

(51) Int. Cl.
*G11C 16/04* (2006.01)

(52) U.S. Cl. .................. 365/185.18; 365/185.2

(58) Field of Classification Search ........... 365/185.18, 365/185.2, 185.22, 185.24, 210.1
See application file for complete search history.

(56) References Cited

U.S. PATENT DOCUMENTS

| 6,639,849 | B2 * | 10/2003 | Takahashi et al. ....... 365/185.03 |
| 6,822,909 | B1 * | 11/2004 | Hamilton et al. ........ 365/185.28 |
| 7,372,743 | B2 * | 5/2008 | Yano et al. ............ 365/185.33 |
| 2006/0168150 | A1 * | 7/2006 | Naik et al. ................ 709/219 |

* cited by examiner

*Primary Examiner*—Vu A Le

(57) ABSTRACT

A nonvolatile memory device that responds to a decrease in electric charge stored in memory cells attributed to the charge loss phenomenon occurring during program operation by adjusting the level of a program verify operation according to the degree of the charge loss so that the program operation can be performed with little (if any) interruption.

20 Claims, 9 Drawing Sheets

NONVOLATILE STORAGE DEVICE AND CONTROL METHOD THEREOF

CROSS-REFERENCES TO RELATED APPLICATIONS

This is a continuation in part of International Application No. PCT/JP2006/340280, filed Dec. 18, 2006 which was not published in English under PCT Article 21(2).

TECHNICAL FIELD

The invention relates to a nonvolatile storage device which uses dynamic reference cells for reading data from memory cells provided with a charge storage layer and a control method thereof. More particularly, the invention relates to the technique of reducing programming time and increasing the accuracy of the data readout.

BACKGROUND ART

In nonvolatile memory cells that retain electric charges to store data in their charge storage layers, repetitive rewriting sometimes causes "a charge loss phenomenon" in which the retained electric charge decreases. The nonvolatile semiconductor storage device disclosed in International Publication No. 2004-097839 Gazette is configured to store 2-bit data in every memory cell by retaining an electric charge in a trap layer made of a nitride film or the like. The trap layer made of a nitride film etc. is an insulating layer. As such, no movement of electric charges occurs therein, so that electric charges can be individually stored in both ends of the trap layer.

However, in the memory cells disclosed above, if the number of rewriting operations increases, the charge loss phenomenon, (i.e., a loss of written electric charge) will occur. To ensure a margin for reading data from memory cells even when the charge loss phenomenon occurs, the read operation is performed using a dynamic reference cell. This dynamic reference cell is a cell to which a bias stress is applied by a rewrite operation similarly to the memory cells.

The dynamic reference cell is comprised of a pair of cells of varying types. Of these cells, one is for data "1" and the other for data "0." In the dynamic reference cell, the average of readout currents from these cells is obtained as a reference current. At the same time a program operation or erase operation is performed on a memory cell, the program operation or erase operation is also performed on the dynamic reference cell, during which a bias stress is also applied to. This causes a charge loss in the reference cell similar to the charge loss that occurs in the memory cell so that a read margin can be ensured.

Generally, a dynamic reference cell is shared among a plurality of memory cells and arranged in the same sector as the memory cells since the occupied area for the nonvolatile storage device is limited. However, this leads to an unfavorable situation that occurs when a target memory cell is programmed and its corresponding reference cell is also programmed to ensure a read margin, while the charge loss phenomenon occurs in other memory cells which share the reference cell with the target memory cell, so that the read margin of these memory cells with respect to the reference cell will be exhausted. Specifically, the charge loss occurs in the memory cells while the reference cell is being programmed, so that the "0" read margin degrades. To avoid this, a refresh operation needs to be performed on these memory cells in order for the memory cells to have the same charge level as a memory cell to be subsequently programmed. In the refresh operation, if the threshold value of the memory cells is lower than a reference voltage level for a normal write verify operation and higher than a reference voltage level for a read operation, a bias is applied in order to settle the charge loss situation, similar to what occurs during the program operation.

In the related art described above, even when a program operation is performed on some memory cells which share the dynamic reference cell, a refresh operation (aka "reprogramming operation") has to be performed on all other memory cells which have already been programmed. This presents a problem as the program operation can take a lot of time.

As provided in the prior art, a bias application for the refresh operation of the memory cells in which charge loss has occurred and a bias application for the program operation of a new target memory cell are performed at the same time. However, in terms of the charge storing condition of the trap layer before the bias application, the memory cells which have lost electric charge but are in a programmed state are different from a memory cell that is still in an erased state prior to programming, Specifically, the former still retains electric charge, whereas the latter stores no electric charge. Therefore, if a bias is applied to these memory cells at the same time, the memory cells which are the targets of the refresh operation may be brought into an excessively programmed state. To solve this problem, the amount of electric charge injected per bias application is limited by setting a bias voltage to be applied to a value lower than the bias voltage of the normal program operation and/or limiting the increasing rate of the bias value of repeatedly performed bias applications to a small value. This, however, brings about an undesirable result in that the program operation performed simultaneously with the refresh operation can take a long time.

SUMMARY OF THE INVENTION

The present invention has been made to overcome the above drawbacks of the prior art and provide a nonvolatile storage device and a control method thereof that responds to a decrease in electric charge stored in memory cells attributed to the charge loss phenomenon occurring during program operation by adjusting the level of a program verify operation according to the degree of the charge loss so that the program operation can be performed with little (if any) interruption.

According to an embodiment of the invention, there is provided a nonvolatile storage device comprising: a plurality of memory cells; and a dynamic reference cell identical in structure to each of the plurality of memory cells that is placed in a memory cell array so that the dynamic reference cell is shared among the plurality of memory cells to provide a reference electric current for a readout operation, wherein, during a program operation executed on each of the plurality of memory cells, a verify voltage for the program operation is adjusted in accordance with a threshold voltage for the dynamic reference cell. In this embodiment there is also provided a control method in the nonvolatile storage device, the control method comprising: executing a program operation on the dynamic reference cell after an erase operation to place the dynamic reference cell in a program state; and executing a program operation on the memory cells, wherein executing the program operation on the memory cells includes adjusting a verify voltage in accordance with a threshold voltage for the dynamic reference cell in the program state. Furthermore, in this embodiment of the invention, in order to perform a program operation on a memory cell, the threshold voltage of the dynamic reference cell is detected and the program operation is executed with a program verify voltage that is adjusted according to the value of this threshold voltage.

In an embodiment with the above arrangement, if electric charge is lost owing to the charge loss phenomenon in the memory cells, the degree of the charge loss can be detected by detecting the threshold voltage of the dynamic reference cell in the program operation. According to the amount of electric charge lost by the charge loss phenomenon, the verify voltage of a subsequent program operation is adjusted, thereby controlling the amount of electric charge stored in the target memory cell of the program operation. This eliminates the need for the performance of a refresh operation on the memory cells and the charged dynamic reference cell to compensate for the lost electric charge, so that the time required for the program operation can be reduced.

According to another embodiment of the invention, there is provided the nonvolatile storage device of the first embodiment and a fixed current source, wherein, during a program operation executed on each of the memory cells, an electric current generated in response to an electric current output from the dynamic reference cell and an electric current output from the fixed current source is used as a reference electric current for a verifying operation. In this embodiment of the invention, there is also provided a programming method in the nonvolatile storage device, the programming method comprising: generating an electric current in response to an electric current output from the dynamic reference cell and an electric current output from a fixed current source; and performing a verifying operation using the electric current generated as a reference electric current. Furthermore, in this embodiment of the invention, during a program verify operation, a current calculated on the basis of a current output from the dynamic reference cell and a current output from a fixed current source is used as a reference current.

In an embodiment with the above arrangement, if the electric charge stored in the memory cells are lost by the charge loss phenomenon, the reference current can be changed within the reference cell according to the degree of the charge loss. In accordance with the amount of electric charge lost by the occurrence of the charge loss phenomenon, the verify voltage of a subsequent program operation and the amount of electric charge trapped in the target memory cell of the program operation are adjusted. Therefore, there would be no need to perform a refresh operation to compensate for the electric charge lost in the memory cells and the dynamic cell, so that the time required for the program operation can be reduced.

According to embodiments of this invention, if charge loss phenomenon occurs in areas of charge storage, the threshold voltage of the program verify operation is adjusted according to the threshold voltage of the dynamic reference cell which has lost electric charge, so that a refresh operation, which has heretofore been needed to compensate for the loss caused by the charge loss phenomenon, is no longer necessary and a program operation that provides proper read margins can be performed within a short time irrespective of the presence/absence of the charge loss phenomenon.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Referring now to FIGS. 1 to 6 of the accompanying drawings, the nonvolatile storage device and nonvolatile storage device control method of the invention is hereinafter described in detail according to preferred embodiments.

Figure 1:
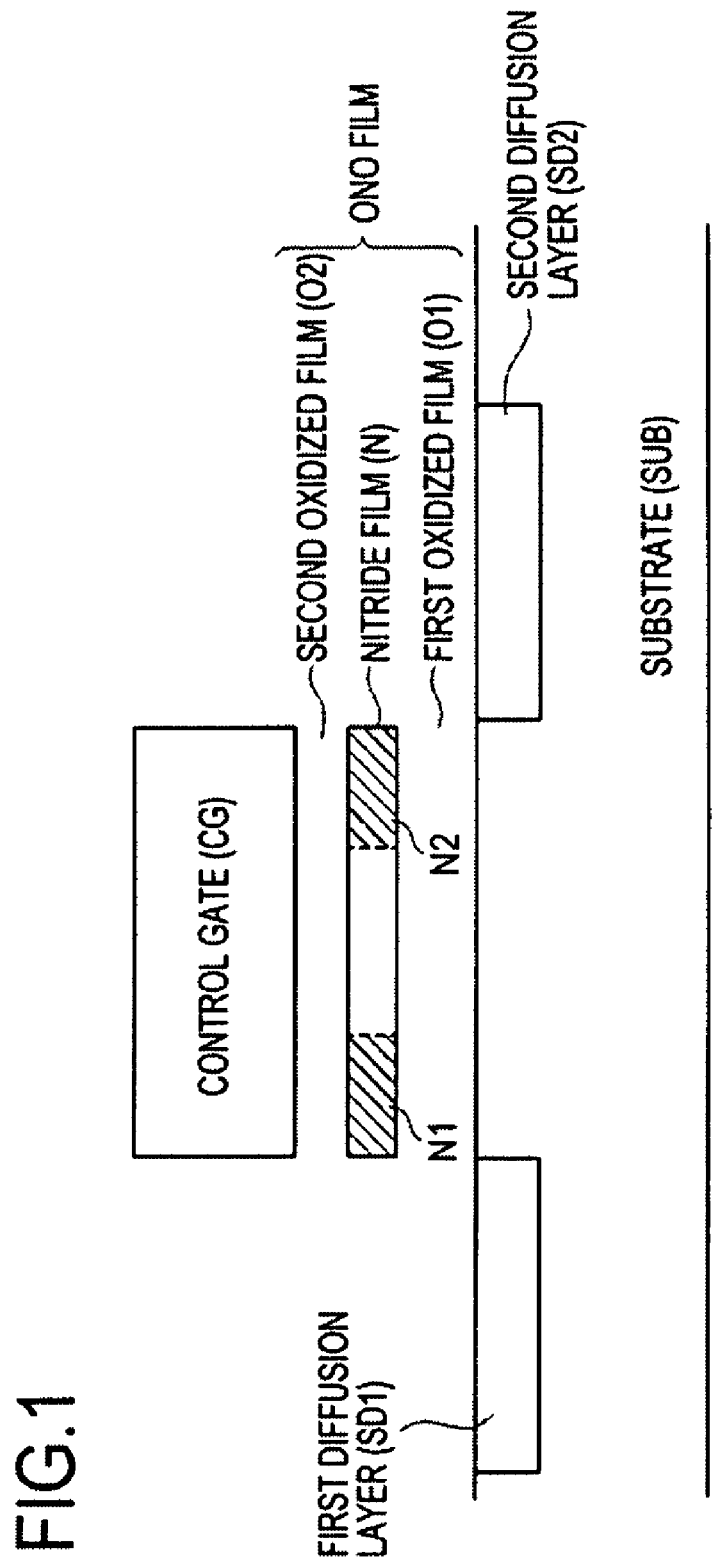
FIG. 1 is a diagram showing the cross-sectional structure of a memory cell having an insulating trap layer in accordance with an embodiment of the invention.

In the nonvolatile memory cell shown in FIG. 1, a first oxidized film O1, a nitride film N and a second oxidized film O2 are stacked between a channel region and a control gate CC, the channel region being placed between first and second diffusion layers SD1, SD2 on the interface of a substrate SUB. The films O1, N, O2 constitute the so-called ONO film. The nitride film N constitutes an insulating trap layer, and the electric charge injected into the nitride film N is trapped by the nitride film N without moving therein. The injection of electric charge is done by the first diffusion layer SD1 or the second diffusion layer SD2 selected according to the bias condition. The trapping of the electric charge is done in either of first and second trap regions N1, N2 in the nitride film N, which regions N1, N2 are in the vicinity of the first and second diffusion layers SD1, SD2, respectively.

Thereby, in a data read operation, 1-bit data is read out, depending on the presence or absence of electric charge in the trap region close to the first or second diffusion layer SD1, SD2 that is biased as a source terminal. By switching the diffusion layer biased as a source terminal between the first diffusion layer SD1 and the second diffusion layer SD2, 1-bit data can be stored in each of the first and second trap regions N1, N2 and the 1-bit data stored in these regions N1, N2 can be read independently. Additionally, storing of 2-bit data per a memory cell is possible.

In some cases, either one of the first and second trap regions N1, N2 is brought into a charge trapped state and 1-bit data is stored in the nonvolatile memory cell according to the presence or absence of trapped electric charge in the other trap region. When electric charge is trapped in either one of the trap regions, charge injection can be carried out more effectively during a program operation that is a charge trapping operation performed on the other trap region, compared to the case where no electric charge is trapped in the trap region. The amount of threshold voltage shifted by the applied bias increases so that the time required for the program operation can be reduced.

Figure 2:
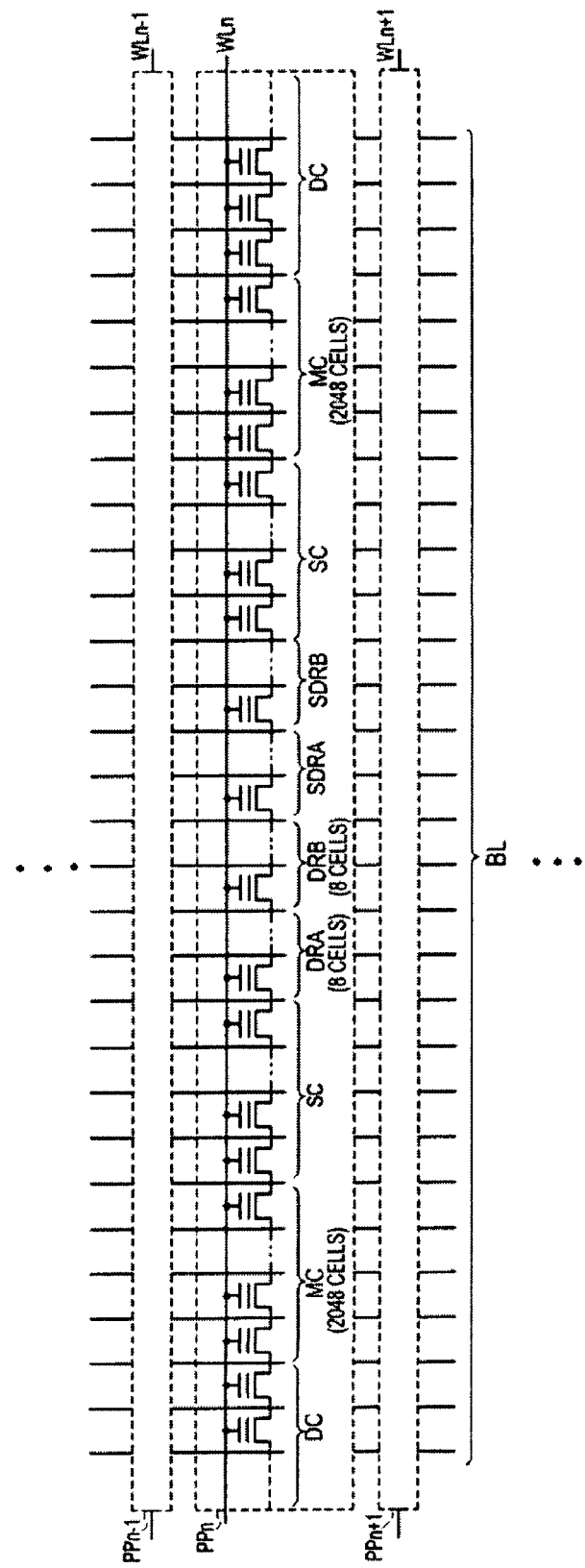
FIG. 2 is a diagram showing, as one example, a connection structure of memory cells in a memory cell array in accordance with an embodiment of the invention.

The connection diagram of the nonvolatile memory cell shown in FIG. 2 illustrates one example of the structure of the memory cell array of the nonvolatile storage device. The memory cell array has a plurality of word lines ( . . . WLn−1, WLn, WLn+1 . . . ) and a plurality of bit lines. The memory cells, dynamic reference cells etc. are placed at the intersections.

In cases where the nonvolatile storage device is constructed by a NAND interface, the unit of the program operation has to be, for instance, one page (2048 bytes). FIG. 2 shows, as one example, a case where one bit data is stored in each nonvolatile memory cell. One page is divided into 4 partial pages and one partial page ( . . . PPn−1, PPn, PPn+1 . . . ) is provided for each word line ( . . . WLn−1, WLn, WLn+1 . . . ).

In the following description, the partial page PPn will be explained as a representative example. Other partial pages ( . . . PPn−1, PPn+1 . . . ) have the same structure as of the partial page PPn. Since one page has 2048 bytes, the partial page PPn stores 4096 bits (2048 bytes×8 bits÷4 partial pages=4096 bits) of bit data. Coupled to the word line WLn are 4096 memory cells MC.

A dummy cell DC is coupled to each end of the word line WLn. The reason for this is that the physical properties of the device are unstable in the end regions of a memory cell array that constitutes a sector. On the inner side of each dummy cell DC, 2048 memory cells MC, spare cells SC, and first and second dynamic reference cells DRB, SDRB; DRA, SDRA are arranged as actual cell groups. On the word line WLn that constitutes the partial page PPn, 4096 memory cells MC are arranged in total. Arranged on the inner side of the memory cells MC are spare cells SC for storing error checking data, file attribute data, etc.; and the first and second dynamic reference cells DRA, SDRA; DRB, SDRB. The first and second dynamic reference cells DRB, DRA are each composed of 8 cells and shared among 4096 memory cells MC.

The dynamic reference cells SDRA, SDRB are reference cells used for reading the spare cells SC. The spare cells SC and the dynamic reference cells SDRA, SDRB for spare cells have the same configuration, functions and effects as of the memory cells MC and the dynamic reference cells DRA, DRB and therefore, an explanation thereof will be omitted in the following description.

In the memory cells having the structure shown in FIG. 1, the dynamic reference cells DRA, DRB are represented by "10" and "01," respectively. Of the two numerals placed side by side, the first one indicates bit data stored in either the first or second trap region N1, N2 to be accessed, whereas the second one indicates the presence or absence of electric charge in the other one of the first and second trap regions N1, N2. Numeral "1" indicates a state in which no electric charge is present, whereas numeral "0" indicates a state in which electric charge is trapped. The data "10" stored in the dynamic reference cell DRA represents a state in which no trapped electric charge is present (bit data "1") and electric charge is trapped in the other one of the opposed trap regions (bit data "0"). The data "01" stored in the dynamic reference cell DRB represents a state in which trapped electric charge is present (bit data "0") and no electric charge is trapped in the other one of the opposed trap regions (bit data "1").

When reading data out from the a memory cell, the read operation is performed, using the average of the current corresponding to the data "1" stored in the dynamic reference cell DRA ("10") and the current corresponding to the data "0" stored in the dynamic reference cell DRB ("01") as a reference current. Setting of the dynamic reference cells is included in the sector erase algorism. That is, after the normal cell and the dynamic reference cells are erased, the dynamic reference cells DRA and DRB are programmed into 10, 01, respectively. The reference cell RC1 (described later) is used for the verify voltage for that time.

When storing bit data according to the presence or absence of electric charge trapped by the trap regions of the nitride film, the charge loss phenomenon, in which the electric charge trapped in the trap regions leaks out, sometimes presents a problem. That is, this phenomenon becomes a problem in cases where the plurality of memory cells MC share the dynamic reference cells DRA, DRB (FIG. 2) and after an erase operation, a program operation is performed a plurality of times with unlimited time intervals between operations. The charge loss phenomenon proceeding between the preceding program operation and the subsequent program operation results in the electric charge of the memory cells in which bit data "0" is stored leaks out and the electric charge trapped in the dynamic reference cell DRB ("01") leaks out. From this condition, a new program operation, which ensures the read margin for the bit data "0," is performed without performing a refresh operation. Embodiments of this technique will be described below.

Figure 3:
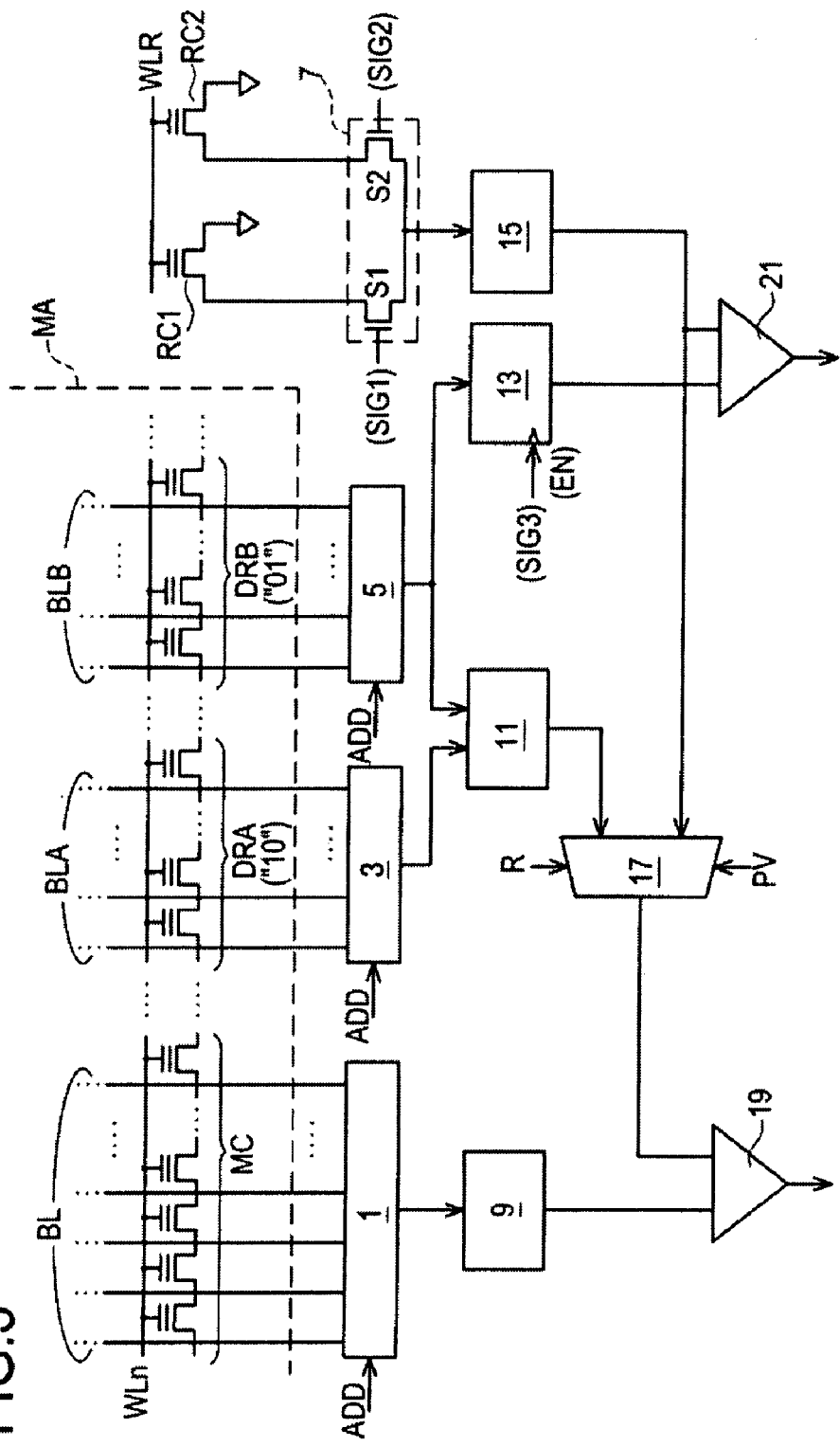
FIG. 3 is a circuit block diagram according to a first embodiment.

FIG. 3 shows a circuit block diagram associated with a first embodiment. Specifically, FIG. 3 shows the configuration of a circuit in which the verify voltage is decreased in the next program operation to be performed if a drop in the threshold voltage of the dynamic reference cell DRB ("01") is checked. This is a circuit portion associated with the verify operation and the read operation performed during a program operation. The memory cells MC and the dynamic reference cells DRA, DRB, which are arranged in the memory cell array MA, are coupled to a common word line WLn. They are also coupled to Y decoders 1, 3 5 through a bit line BL and bit lines BLA, BLB, respectively.

In response to an address signal ADD, the Y decoders 1, 3, 5 select a memory cell MC that is a target of a reading operation, and the dynamic reference cells DRA and DRB corresponding to this memory cell MC and couples them to cascode circuits 9, 11, 13 respectively.

The cascode circuits 9, 11, 13 apply a specified voltage to the bit lines BL, BLA, BLB and detect and convert a current flowing in the memory cell MC etc. into a voltage signal when reading bit data stored in the memory cell MC and the dynamic reference cells DRA, DRB.

Herein, the bit line BL, to which the target memory cell selected by the Y decoder 1 is coupled, is coupled to the cascode circuit 9. The bit data stored in the target memory cell MC is read out as a current which is in turn converted into a voltage signal in the cascode circuit 9.

The cascode circuit 11 couples to the Y decoders 3, 5. The bit lines BLA, BLB selected by the Y decoders 3, 5, to which the dynamic reference cells DRA, DRB corresponding to the target memory cell MC are respectively coupled, are also coupled to the cascode circuit 11. The bit data "1" is read out from the dynamic reference cell DRA and the bit data "0" is read out from the dynamic reference cell DRB. The average of these bit data is obtained in the cascode circuit 11 and then converted into a voltage signal. Thus, the cascode circuit 11 provides a reference used for the normal read operation.

The cascode circuit 13 couples to the bit line BLB, to which the dynamic reference cell DRB selected by the Y decoder 5 is coupled. The cascode circuit 13 has an enable terminal and inputs a control signal (SIG3) indicative of the verify operation of the dynamic reference cell DRB described later with reference to the flow chart of FIG. 4. The cascode circuit 13 is activated during the verify operation of the dynamic reference cell DRB. The bit data "0" stored in the selected dynamic reference cell DRB is read out as a current which is in turn converted into a voltage signal in the cascode circuit 13.

Reference cells RC1, RC2 are provided outside the memory cell array. The threshold voltage of the reference cell RC1 is a threshold voltage used in the normal program operation. On the other hand, the threshold voltage of the reference cell RC2 is set to a value lower than the threshold voltage of the reference cell RC1. For instance, the threshold voltage of the reference cell RC2 is set to a value at which refresh operation is determined to be necessary in the related art. If the voltage is lower than this threshold voltage, a refresh operation will be performed. The gate terminals of the reference cells RC1, RC2 are coupled to a reference word line WLR. The reference word line WLR is activated by a control circuit (not shown) in response to control signals (SIG1), (SIG2).

A Y decoder 7 selects either one of the reference cells RC1, RC2. More concretely, either of switch devices S1, S2 provided in the Y decoder 7 is selectively brought into a conducting state according to the control signals (SIG1), (SIG2), thereby coupling either the reference cell RC1 or RC2 to a cascode circuit 15. The cascode circuit 15 has the same functions and effects as of the cascode circuit 9. Therefore, a detailed description thereof is omitted herein.

The cascode circuits 13, 15 are coupled to a comparator 21. In response to the activation of the cascode circuit 13 by the control signal (SIG3) and the selection of the dynamic reference cell DRB, the control signal (SIG 2) is also activated and the reference cell RC2 is coupled to the cascode circuit 15. The comparator 21 makes a comparison between the threshold voltage of the dynamic reference cell DRB and the threshold voltage of the reference cell RC2. As shown in the flow chart of FIG. 4 described later, in the second and later program operations out of the plurality of program operations, either the reference cell RC1 or RC2 is selected as a reference cell for the program verify operation according to whether the threshold voltage of the dynamic reference cell DRB is higher or lower than the threshold voltage of the reference cell RC2.

After the data current is converted into a voltage signal in the cascode circuit 15, the selected reference cell RC1 or RC2 is coupled to either of the input terminals of a selector circuit 17. The other input terminal of the selector circuit 17 is coupled to the cascode circuit 11. The output terminal of the selector circuit 17 is coupled to a comparator 19. The cascode circuit 9 is coupled to the comparator 19. The selector circuit 17 makes a selection in accordance with a read signal R and a program verify signal PV.

If the read signal R is activated in a read operation, the cascode circuit 11 is selected and the normal read operation is performed in the comparator 19. If the program verify signal PV is activated in a program operation, the cascode circuit 15 is selected and a program verify operation is performed on the reference cell set according to the threshold voltage of the dynamic reference cell DRB in the comparator 19

The verify voltage of the new program operation can be optimized according to the charge trap condition caused by the charge loss in the memory cells MC and the dynamic reference cell DRB (the charge trap condition of the dynamic reference cell DRB is detected as a representative). Specifically, if the threshold voltage of the dynamic reference cell DRB is lower than the threshold voltage of the reference cell RC2 and it is judged that electric charge has leaked out up to the level at which the related art requires refresh operation, the verify voltage of the program operation is made equal to the threshold voltage of the reference cell RC2 which is lower than the threshold voltage of the reference cell RC1, i.e., the verify voltage of the normal program operation. If the threshold voltage of the dynamic reference cell DRB exceeds the threshold voltage of the reference cell RC2, refresh operation is unnecessary and the verify voltage of the program operation is made equal to the threshold voltage of the reference cell RC1 which is the verify voltage of the normal program operation.

Herein, the reference cells RC1, RC2 are placed outside the memory cell array and each terminal is coupled separately from the memory cells MC etc. arranged within the memory cell array. Therefore, the bias stresses such as readout, erase and program, which are applied to the memory cells MC etc., are not applied to the reference cells RC1, RC2. It should be noted that the reference cells RC1, RC2 exemplify the first and second reference cells, respectively.

Figure 4:
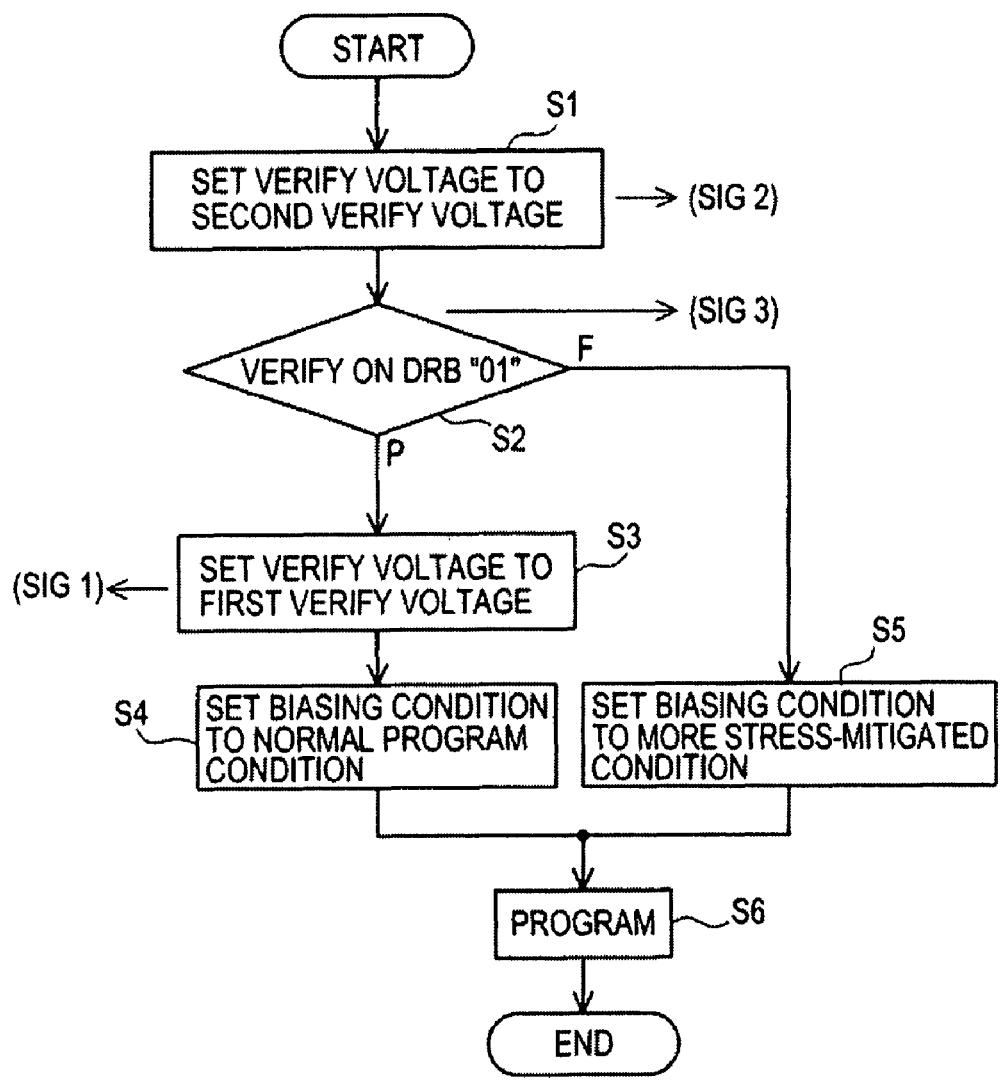
FIG. 4 is a flow chart of an operation according to the first embodiment.

FIG. 4 shows a flow chart of the first embodiment. Specifically, it shows the flow of a procedure for determining a verify voltage program in a program operation. After starting a program operation, the program verify voltage is first set to a second verify voltage (Step S1). At the same time, the control circuit (SIG2) is activated. The control signal (SIG2) is for indicating that the verify voltage has been set to the second verify voltage.

Herein, the second verify voltage is a voltage lower than a first verify voltage which is equal to the verify voltage of the normal program operation. The second verify voltage is equal to the level to which the threshold voltage has dropped owing to a leak of trapped electric charge so that a need for refresh operation arises in the related art. In FIG. 3, the second verify voltage is the threshold voltage of the reference cell RC2.

Next, a verify operation is performed on the dynamic reference cell DRB ("01") in a programmed state in which electric charge is trapped (Step S2). At the same time, the control circuit (SIG3) is activated. The control signal (SIG3) is a signal indicating that a verify operation is performed on the dynamic reference cell DRB.

If the verification passes (Step S2:P), it is indicated that the threshold voltage of the dynamic reference cell DRB exceeds the second verify voltage, so that the leakage of electric charge caused by the charge loss phenomenon is determined to be small. The verify voltage is set to the first verify voltage (Step S3). At the same time, the control circuit (SIG1) is activated. The control signal (SIG1) is a signal indicating that the verify voltage has been set to an intended value by the first verify voltage. In FIG. 3, the intended value is the threshold voltage of the reference cell RC1. Further, the biasing condition for the program operation is set to the normal condition (S4). Thereafter, the normal program operation is performed (Step S6).

If the verification fails (Step S2:F), it is indicated that the threshold voltage of the dynamic reference cell DRB is lower than the second verify voltage, so that it is determined that the threshold voltages of the memory cells MC and the dynamic reference cell DRB which are in their programmed states have dropped owing to the leak of electric charge caused by the charge loss phenomenon. While the verify voltage being kept to the second verify voltage, the biasing condition of the program operation is more stress-mitigated, compared to the normal condition (Step S5). Thereafter, a program operation is performed with the mitigated biasing stress condition until the lowered threshold voltage is reached (Step S6). The stress mitigation stated herein means the reduction of the time required for pulse application, the reduction of the increasing rate of bias stress pulses, and the like when a bias stress is applied in the form of sequential pulses.

Figure 5:
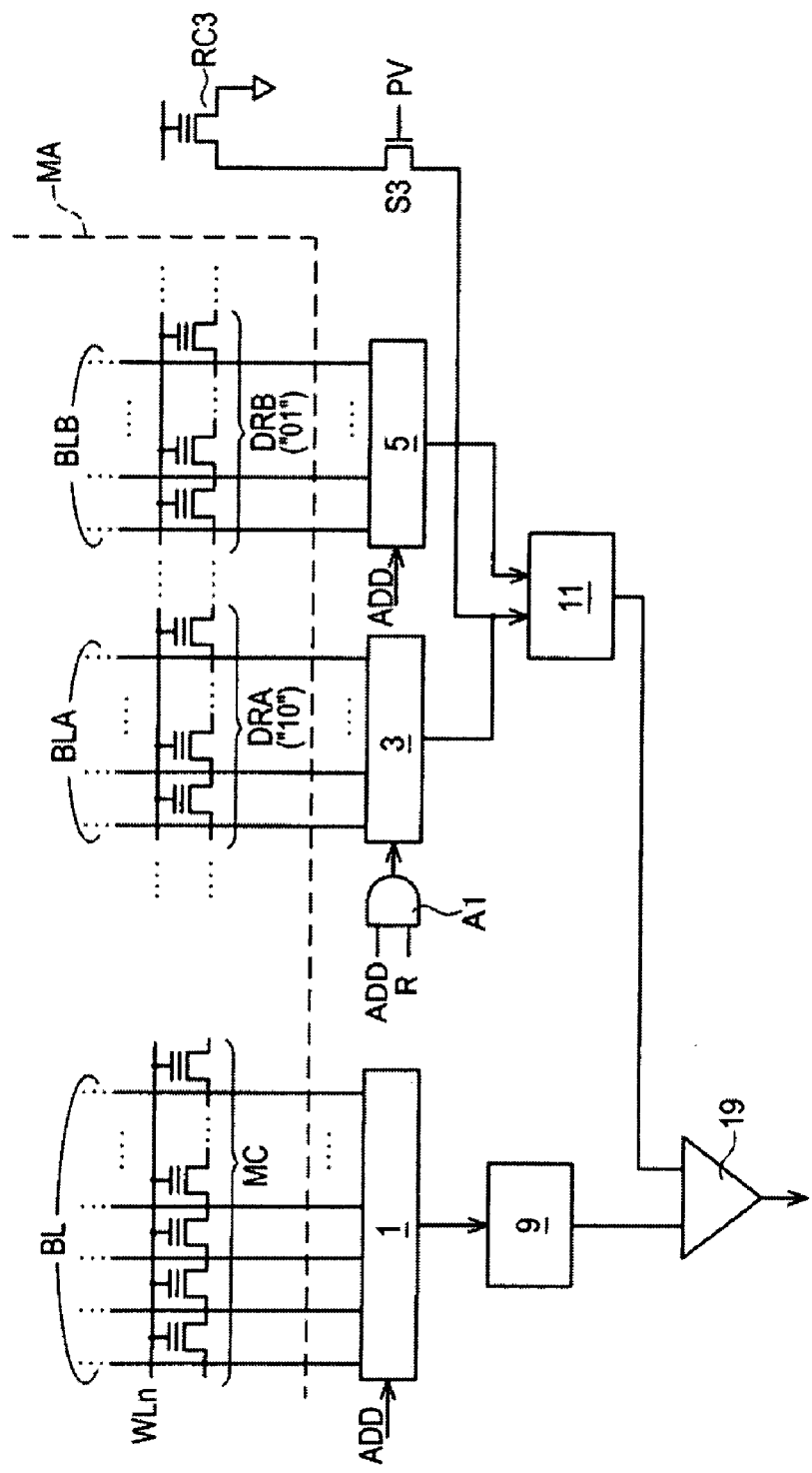
FIG. 5 is a circuit block diagram according to a second embodiment.

FIG. 5 is a circuit block diagram associated with a second embodiment. Specifically, FIG. 5 shows a circuit configuration for adjusting the verify voltage of a newly performed program operation in accordance with the degree of the charge loss phenomenon which has occurred within the memory cell array MA. A reference cell RC3 and a switch device S3 are provided in place of the reference cells RC1, RC2 and the switch devices S1, S2, distinguishable from the first embodiment. The cascode circuits 13, 15 are not provided and the switch device S3 is incorporated into the cascode circuit 11 together with the Y decoder 3. Herein, according to the logical multiplication of an address signal ADD and a read signal R by an AND circuit A1, the Y decoder 3 selects the dynamic reference cell DRA ("10") corresponding to the memory cell MC that is a target of reading. In addition, the selector circuit 17 is not provided but the cascode circuit 11 is coupled to the comparator 19.

The switch device S3 becomes conductive in response to a program verify signal PV. On the other hand, the Y decoder 3 makes a selection according to an address signal in response to the read signal R. That is, the dynamic reference cell DRA is coupled to either of the input terminals of the cascode circuit 11 through the Y decoder 3 during a readout operation in which the read signal R is activated. During a program operation in which the program verify signal PV is activated, the reference cell RC3 is coupled to either of the input terminals of the cascode circuit 11 through the switch device 3. Herein, the dynamic reference cell DRB is coupled to the other input terminal of the cascode circuit 11 through the Y decoder 5.

In the cascode circuit 11, during a readout operation, the average of the cell currents from the dynamic reference cells DRA, DRB is obtained and then converted into a voltage signal so that a reference voltage is output to the comparator 19. Thus, a normal readout operation is performed in which bit data is read out from the memory cell, using the average value of the dynamic reference cells DRA and DRB as a reference value.

In the program operation, the average of the cell currents of the reference cell RC3 and the dynamic reference cell DRB is obtained and converted into a voltage signal so that a reference voltage is output to the comparator 19. Then, a program verify operation is performed such that the bit data from the memory cell is verified, using the average value of the reference cell RC3, i.e., a fixed reference value and the value of the dynamic reference cell DRB in its programmed state.

The reference cell RC3 is placed outside the memory cell array and each terminal is coupled separately from the memory cells MC etc. arranged within the memory cell array. Therefore, the bias stresses such as readout, erase and program applied to the memory cells MC etc. are not applied to the reference cell RC3. Accordingly, in the reference cell RC3, the charge loss phenomenon and the variations in the threshold voltage are negligible.

In the second embodiment, the average value of the reference cell RC3 and the dynamic reference cell DRB is used as the program verify voltage. It is therefore convenient to make the threshold voltage of the reference cell RC3 equal to the normal program verify voltage. If the charge loss phenomenon does not occur in the memory cells MC etc. within the memory cell array, the verify voltage for the normal program operation is set as the average verify voltage. If the charge loss phenomenon occurs, the verify voltage is shifted from the normal program verify voltage to a lower value.

Herein, the reference cell RC3 serves as one example of the third reference cell. The dynamic reference cells DRA ("10") and DRB ("01") serve as examples of the first and second dynamic cells, respectively. The cascode circuit 11 serves as one example of the averaging circuit, and the Y decoder 3, the switch device 3 and the AND circuit A1 constitute a section that is one example of the switching section.

Although the second embodiment has been described with a case where the cascode circuit 11 is used for obtaining the average of the current values of the reference cell RC3 and the dynamic reference cell DRB to set a verify voltage, the invention is not necessarily limited to this. Alternatively, a verify voltage may be set by proportional distribution with different weights added to the current values. In this case, by adding a great weight to the reference cell RC3, a value in the vicinity of the normal program verify voltage can be set as the verify voltage. By adding a great weight to the dynamic reference cell DRB, a value in the vicinity of the threshold voltage corresponding to the charge loss state can be set as the verify voltage. In addition, when deciding a proportion, it is desirable to take account of changes in the device properties caused by environmental temperature and changes in the device properties within the power source voltage range. In addition, although the second embodiment has been described with a case in which the reference cell RC3 is used as a fixed current source, it is apparent that the same functions and effects can be achieved by other arrangements as far as a fixed power source is provided.

Figure 6:
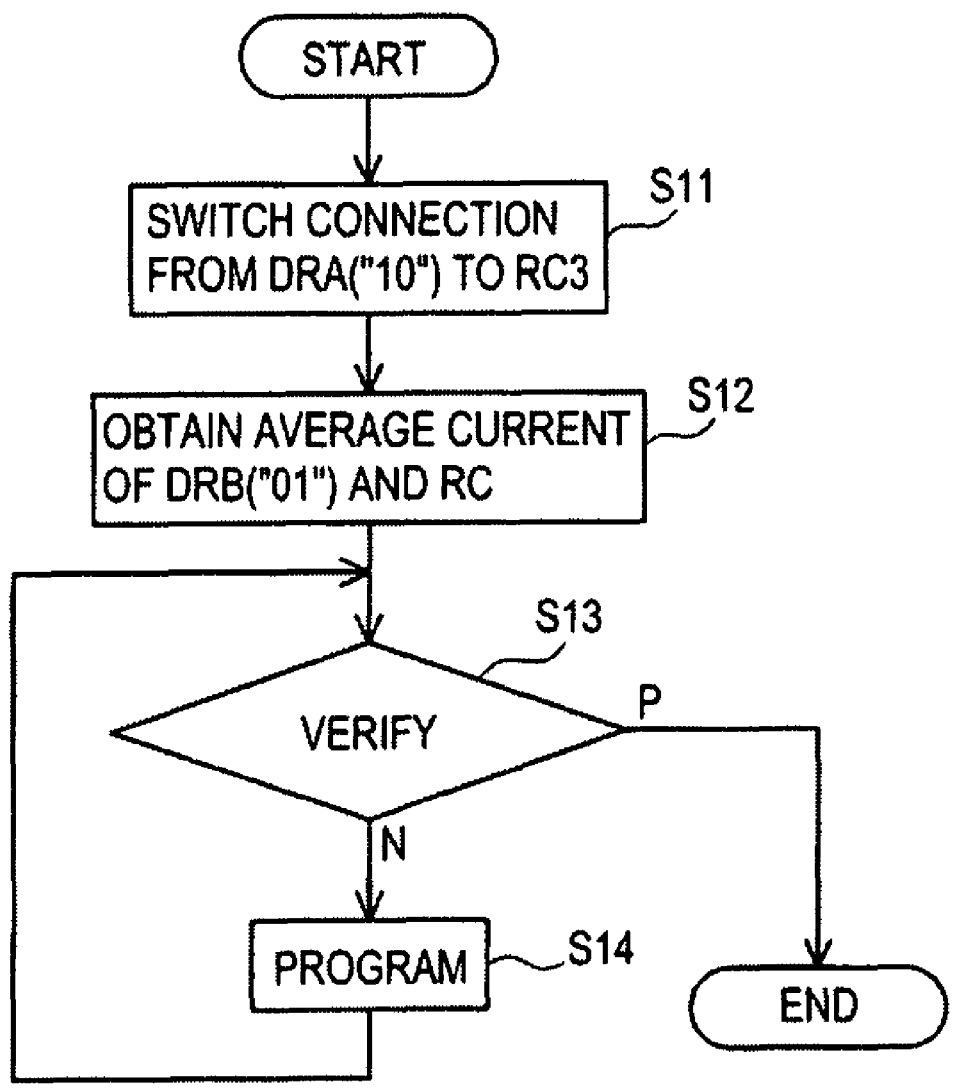
FIG. 6 is a flow chart of an operation according to the second embodiment.

FIG. 6 shows a flow chart associated with the second embodiment. This flow chart shows the flow of a procedure with which the program verify voltage is adjusted, followed by a program operation. After a program operation has started, the dynamic reference cell DRA ("10") is uncoupled from the cascode circuit 11 and the reference cell RC3 is coupled to the cascode circuit 11 (Step S11). Thereby, in the cascode circuit 11, the average of the current of the dynamic reference cell DRB ("01") and the current of the reference cell RC3 is obtained and then converted into a voltage signal (Step S12).

Next, a program verify operation is performed on the memory cell MC that is a target of the program operation (Step S13). If the verification passes (Step S13:P), it is determined that the program operation on the memory cell MC has been completed, so that the program operation is ended. If the verification fails (Step S13:F), it is determined that the program operation on the memory cell MC has not been completed, so that the program operation continues (Step S14).

In the flow chart of FIG. 6, the average voltage of the dynamic reference cell DRB ("01") and the reference cell RC3 is set as the verify voltage (Step S12). This verify voltage is applied to the second and later program operations in cases where a program operation is performed a plurality of times after an erase operation. In the first program operation after an erase operation, programming of the dynamic reference cell DRB may be performed, using the threshold voltage of the reference cell RC3 as the verify voltage. Thereby, the threshold voltage of the dynamic reference cell DRB can be initialized to the threshold voltage of the normal programmed state. If the setting of the threshold voltage of the reference cell RC3 differs from the threshold voltage of the normal programmed state, the verify voltage may be adjusted by adding or subtracting an auxiliary current to or from the current read out of the reference cell RC3.

As understood from the foregoing description, according to the first embodiment, it is possible to check whether the threshold voltage has dropped owing to the charge loss phenomenon, by comparing, in a program operation, the threshold voltage of the dynamic reference cell DRB ("01") in the programmed state with the threshold voltage of the reference cell RC2 which is lower than the threshold voltage of the reference cell RC1. In this case, the memory cell MC in the programmed state could be in the same charge loss condition. If the threshold voltage of the dynamic reference cell DRB is lower than the threshold voltage of the reference cell RC2, the next program operation is performed with the verify voltage which has been changed from the threshold voltage of the reference cell RC1 to the threshold voltage of the reference cell RC2. Thereby, the memory cell MC can be brought into the same programmed state as of the memory cell MC which has been programmed by the preceding program operation and subjected to the charge loss phenomenon.

According to the second embodiment, since the verify voltage is set to the average of the dynamic reference cell DRB ("01") and the reference cell RC3 during program verification, if the electric charge trapped by the insulating trap layer is lost because of the charge loss phenomenon, the verify voltage can be changed according to the amount of lost electric charge. In this case, the memory cell MC in the programmed state could be in the same charge loss condition. The verify voltage for the newly performed program operation is adjusted according to the amount of electric charge lost by occurrence of the charge loss phenomenon and therefore the amount of electric charge trapped by the memory cell MC which is a target of programming is adjusted, so that this memory cell MC can be brought into the same condition as of the memory cell MC programmed in the preceding program operation.

There is no need to perform a refresh operation on the memory cells MC and the dynamic reference cell DRB to compensate for the lost electric charge, so that the time required for the program operation can be reduced and the read margin can be ensured.

It is apparent that the invention is not necessarily limited to the particular embodiments shown herein and various changes and modifications are made to the disclosed embodiments without departing from the spirit and scope of the invention.

For instance, while the first embodiment has been described in the context of a configuration in which the first and second reference cells RC1, RC2 are provided, the invention is not necessarily limited to this. The invention is also applicable to cases where three or more reference cells having different threshold voltages are provided. In this application, the charge loss condition of the dynamic reference cell DRB can be detected through multiple stages and a finer adjustment of the program verify voltage can be made.

While the second embodiment has been described in the context of a configuration in which the average value of the third reference cell RC3 and the dynamic reference cell DRB is set as a reference voltage, the invention is not necessarily limited to this. Alternatively, a fine adjustment of the verify voltage can be made by changing weights added to the respective cells in the proportional distribution and/or by changing the threshold voltage of the reference cell RC3. The memory cells are not limited to the type having an insulating trap layer but the same effects can be achieved by floating gate type memory cells.

Embodiments generally relate to nonvolatile memory devices. More particularly, embodiments allow for a nonvolatile memory device that responds to a decrease in electric charge stored in memory cells attributed to the charge loss phenomenon occurring during program operation by adjusting the level of a program verify operation according to the degree of the charge loss so that the program operation can be performed with little (if any) interruption. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 7:
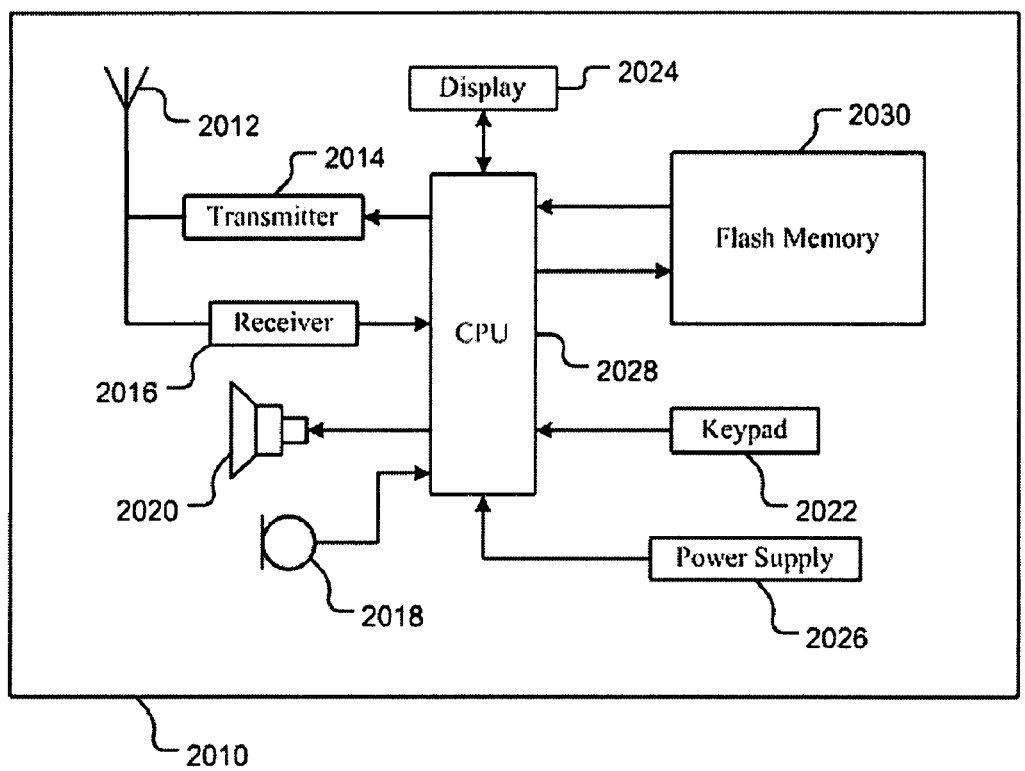
FIG. 7 illustrates a block diagram of an exemplary portable phone, upon which various embodiments of the invention may be implemented.

FIG. 7 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a nonvolatile memory device that responds to a decrease in electric charge stored in memory cells attributed to the charge loss phenomenon occurring during program operation by adjusting the level of a program verify operation according to the degree of the charge loss so that the program operation can be performed with little (if any) interruption. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 8:
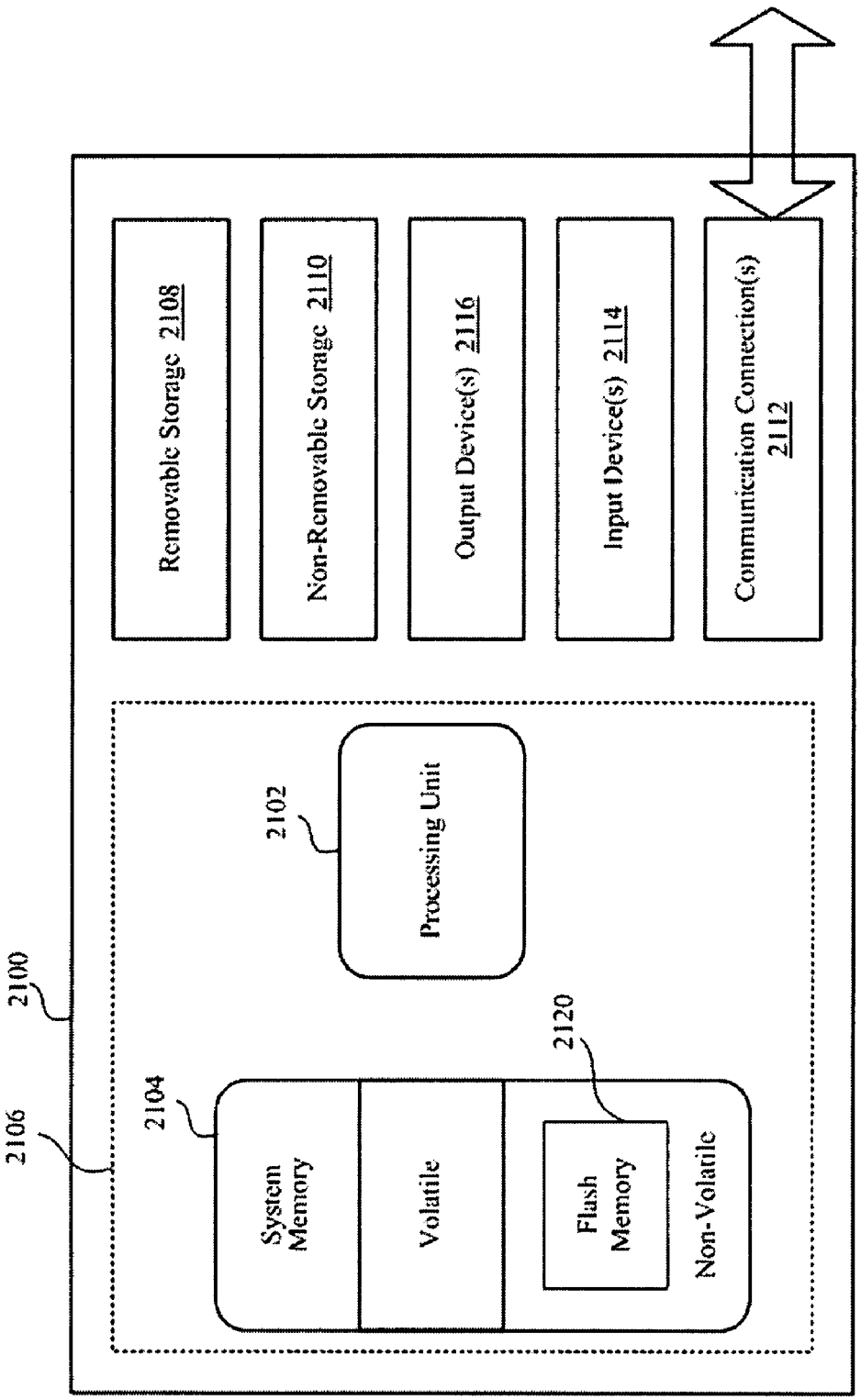
FIG. 8 illustrates a block diagram of an exemplary computing device, upon which various embodiments of the invention may be implemented.

FIG. 8 illustrates a block diagram of an exemplary computing device 2100, upon which various embodiments of the invention can be implemented. Although computing device 2100 is shown and described in FIG. 8 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 8.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 8 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 8 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a nonvolatile memory device that responds to a decrease in electric charge stored in memory cells attributed to the charge loss phenomenon occurring during program operation by adjusting the level of a program verify operation according to the degree of the charge loss so that the program operation can be performed with little (if any) interruption. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 9:
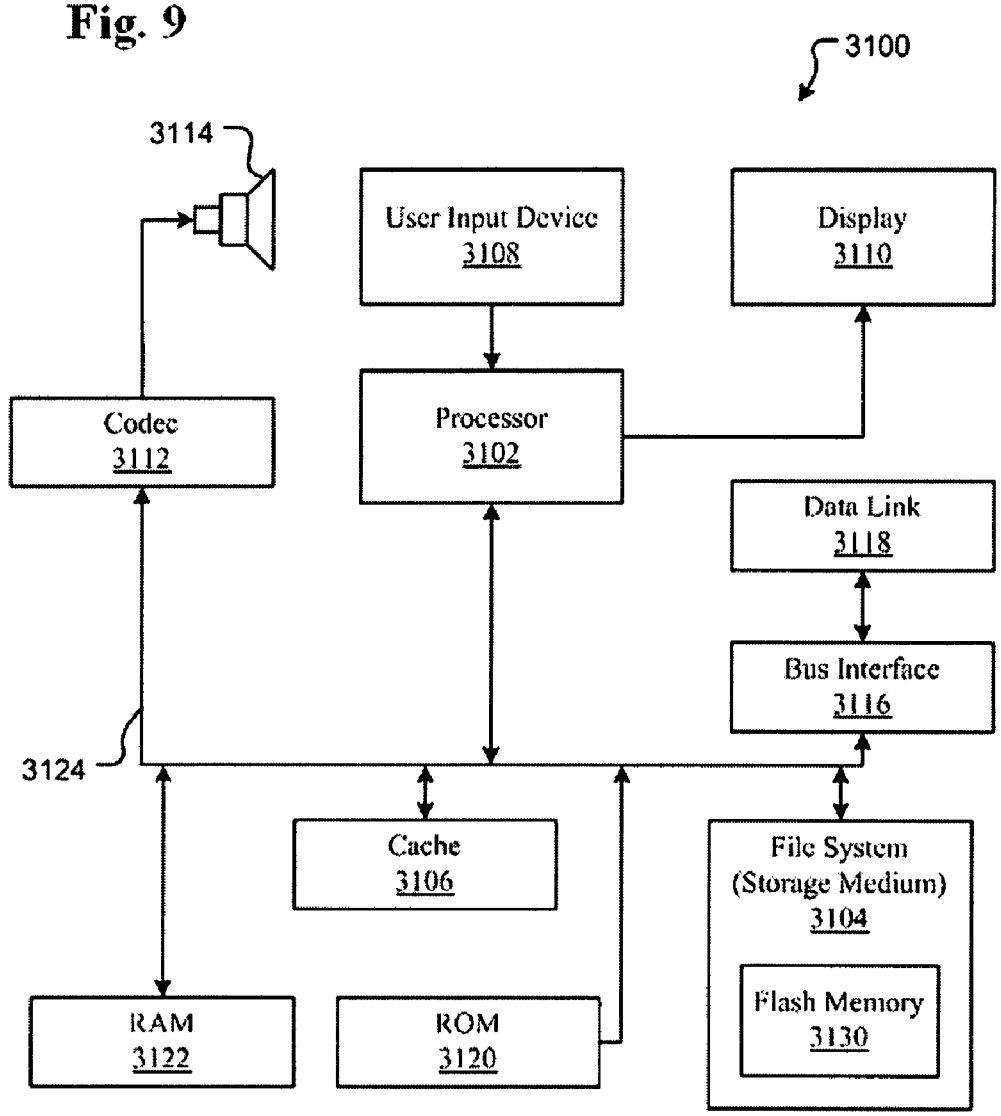
FIG. 9 illustrates an exemplary portable multimedia device, or media player, in accordance with various embodiments of the invention.

FIG. 9 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 can include a nonvolatile memory device that responds to a decrease in electric charge stored in memory cells attributed to the charge loss phenomenon occurring during program operation by adjusting the level of a program verify operation according to the degree of the charge loss so that the program operation can be performed with little (if any) interruption. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A nonvolatile storage device including a memory cell array, the memory cell array comprising:
    a plurality of memory cells; and
    a dynamic reference cell identical in structure to each of the plurality of memory cells, wherein:
        the dynamic reference cell is shared among the plurality of memory cells;
        and the dynamic reference cell provides a reference electric current for a readout operation to the plurality of memory cells; and
    wherein, during a program operation executed on the plurality of memory cells, a verify voltage for the program operation is adjusted in accordance with a threshold voltage for the dynamic reference cell.

2. The nonvolatile storage device according to claim 1, wherein the threshold voltage for the dynamic reference cell is detected when a verifying operation is performed on the dynamic reference cell.

3. The nonvolatile storage device according to claim 2, wherein:
    the threshold voltage for the dynamic reference cell is detected when a verifying operation is performed on the dynamic reference cell; and
    the verifying operation performed on the dynamic reference cell with a second verify voltage is lower than a first verify voltage used for a normal program execution.

4. The nonvolatile storage device according to claim 3, further comprising a first reference cell and a second reference cell located outside the memory cell array, wherein:
    the first verify voltage is a threshold voltage for the first reference cell; and
    the second verify voltages is a threshold voltage for the second reference cell.

5. The nonvolatile storage device according to claim 3, wherein:
    the dynamic reference cell performs the verifying operation with the second verify voltage during a subsequent program operation when the threshold voltage for the dynamic reference cell is lower than the second verify voltage; and
    the dynamic reference cell performs the verifying operation with the first verify voltage during the subsequent program operation when the threshold voltage for the dynamic reference cell is higher than the second verify voltage.

6. The nonvolatile storage device according to claim 3, wherein:
    the dynamic reference cell applies a normal bias stress during a subsequent program operation when the threshold voltage for the dynamic reference cell is higher than the second verify voltage; and
    the dynamic reference cell mitigates a bias stress during the subsequent program operation when the threshold voltage for the dynamic reference cell is lower than the second verify voltage.

7. The nonvolatile storage device according to claim 6, wherein the dynamic reference cell mitigates the bias stress in accordance with a reduction in pulse applying time as compared with the pulse applying time when applying the normal bias stress and/or a reduction in a bias voltage.

8. The nonvolatile storage device according to claim 1, wherein the dynamic reference cell further comprises:
    a first dynamic reference cell in a program state; and
    a second dynamic reference cell in an erase state.

9. The nonvolatile storage device according to claim 8, wherein the verify voltage for the program operation is adjusted in accordance with a threshold voltage for the first dynamic reference cell.

10. The nonvolatile storage device according to claim 1, further comprising a fixed current source, wherein during a program operation executed on each of the memory cells an electric current generated in response to an electric current output from the dynamic reference cell and an electric current output from the fixed current source being used as a reference electric current for a verifying operation.

11. The nonvolatile storage device according to claim 10, further comprising:
    a first dynamic reference cell in a program state;
    a second dynamic reference cell in an erase state;
    an averaging circuit which is coupled to the first and second dynamic reference cells to average the electric current provided by the first and second dynamic reference cells; and
    a switching section for, during the program verifying operation, switching between disconnecting the averaging circuit from the second dynamic reference cell and connecting the averaging circuit to the fixed current source.

12. A control method in a nonvolatile storage device comprising:
    a plurality of memory cells; and
    a dynamic reference cell equal in structure to each memory cell, wherein:
        the dynamic reference cell is placed in a memory cell array;
        the dynamic reference cell is shared among the memory cells; and
        the dynamic reference cell provides a reference electric current for a readout operation to the plurality of memory cells,
    the control method comprising the steps of:
        executing a program operation on the dynamic reference cell after an erase operation to place the dynamic reference cell in a program state; and
        executing a program operation on the memory cells,
    wherein said executing the program operation on the memory cells includes adjusting a verify voltage in accordance with a threshold voltage for the dynamic reference cell in the program state.

13. The control method in the nonvolatile storage device according to claim 12, wherein said executing the program operation on the memory cells includes, prior to adjusting the verify voltage, performing a verify operation on the dynamic reference cell in the program state.

14. The control method in the nonvolatile storage device according to claim 13, wherein:

said performing the said verify operation on the dynamic reference cell includes performing the verify operation with a second verify voltage; and said second verify voltage is lower than a first verify voltage of a verify operation performed during a normal program operation.

15. The control method in the nonvolatile storage device according to claim 14, wherein said performing the said verify operation on the dynamic reference cell comprises:

performing the verifying operation with the second verify voltage when the threshold voltage for the dynamic reference cell is lower than the second verify voltage; and performing the verifying operation with the first verify voltage when the threshold voltage for the dynamic reference cell is higher than the second verify voltage.

16. The control method in the nonvolatile storage device according to claim 14, wherein executing the program operation on the memory cells includes applying a bias with mitigated stress as compared with a bias to be applied during execution of a normal program operation when the threshold voltage is lower than the second verify voltage during said performing the said verify operation on the dynamic reference cell.

17. A system, comprising:

a processor;

a cache;

a user input component; and a flash memory comprising:

a memory cell array, the memory cell array comprising:

a plurality of memory cells; and a dynamic reference cell identical in structure to each of the plurality of memory cells shared among the plurality of memory cells to provide a reference electric current for a readout operation, wherein, during a program operation executed on each of the plurality of memory cells, a verify voltage for the program operation is adjusted in accordance with a threshold voltage for the dynamic reference cell.

18. The system as recited in claim 17 wherein the system is comprises a portable media player.

19. The system as recited in claim 17 wherein the system is comprises a cellular telephone.

20. The system as recited in claim 17 wherein the system is comprises a computing device.

\* \* \* \* \*